US009410247B2

(12) United States Patent
Lee et al.

(10) Patent No.: US 9,410,247 B2
(45) Date of Patent: Aug. 9, 2016

(54) CHEMICAL VAPOR DEPOSITION APPARATUS

(71) Applicant: Samsung Electronics Co., Ltd., Suwon-si, Gyeonggi-do (KR)

(72) Inventors: Jong Hyun Lee, Seoul (KR); Hyun Seok Ryu, Gyeonggi-do (KR); Jung Hyun Lee, Gyeonggi-do (KR); Ki Sung Kim, Gyeonggi-do (KR); Suk Ho Yoon, Seoul (KR); Young Sun Kim, Gyeonggi-do (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 542 days.

(21) Appl. No.: 13/655,696

(22) Filed: Oct. 19, 2012

(65) Prior Publication Data

US 2013/0098293 A1    Apr. 25, 2013

(30) Foreign Application Priority Data

Oct. 20, 2011    (KR) .................. 10-2011-0107485

(51) Int. Cl.
*C23C 16/455* (2006.01)
*C23C 16/458* (2006.01)
*H01L 21/02* (2006.01)

(52) U.S. Cl.
CPC ....... *C23C 16/45565* (2013.01); *C23C 16/4558* (2013.01); *C23C 16/4583* (2013.01); *C23C 16/45578* (2013.01); *H01L 21/0254* (2013.01); *H01L 21/0262* (2013.01); *H01L 21/02573* (2013.01)

(58) Field of Classification Search
CPC ................... C23C 16/45565; C23C 16/45578; C23C 16/4583; C23C 16/4558; H01L 21/0254; H01L 21/0262; H01L 21/02573
USPC ....................... 118/715; 156/345.33
See application file for complete search history.

(56) References Cited

U.S. PATENT DOCUMENTS 4,664,747 A * 5/1987 Sekiguchi ........... H01L 21/3185
118/50.1
4,989,540 A * 2/1991 Fuse .................... C23C 16/4405
118/715

(Continued)

FOREIGN PATENT DOCUMENTS

JP          09055372 A  *  2/1997
KR    1020020092119 A    12/2002

(Continued)

*Primary Examiner* — Rudy Zervigon
(74) *Attorney, Agent, or Firm* — Renaissance IP Law Group LLP

(57) ABSTRACT

A chemical vapor deposition apparatus can include a reaction chamber having a reaction space therein; a wafer boat disposed in the reaction space, the wafer boat arranged and structured to support a plurality of wafers; and a gas supplying part disposed in the reaction chamber to supply two or more reaction gases to the plurality of wafers. The gas supplying part can include a plurality of gas pipes disposed in the reaction chamber to supply the two or more reaction gases from outside to the reaction space; and a plurality of supplying pipes disposed around the wafer boat, wherein each of the supplying pipes is connected to two or more corresponding gas pipes, and wherein each supplying pipe is configured to supply the two or more reaction gases supplied by the two or more corresponding gas pipes to a corresponding one of the wafers.

18 Claims, 6 Drawing Sheets

(56) References Cited

U.S. PATENT DOCUMENTS

| | | | | |
|---|---|---|---|---|
| 5,010,842 A * | 4/1991 | Oda | .................. | C23C 16/452 118/715 |
| 5,279,670 A * | 1/1994 | Watanabe | ......... | H01L 21/67115 118/715 |
| 5,330,352 A * | 7/1994 | Watanabe | ............... | C30B 31/16 432/152 |
| 5,376,628 A * | 12/1994 | Sekiguchi | ............. | C23C 16/408 427/535 |
| 5,429,070 A * | 7/1995 | Campbell | ............. | C23C 16/513 118/719 |
| 5,458,685 A * | 10/1995 | Hasebe | ............... | C23C 16/4401 118/715 |
| 5,482,558 A * | 1/1996 | Watanabe | ............... | C30B 31/14 118/500 |
| 5,503,678 A * | 4/1996 | Usami | ............... | C23C 16/45589 118/715 |
| 5,522,934 A * | 6/1996 | Suzuki | ................. | C23C 16/455 118/723 AN |
| 5,522,936 A * | 6/1996 | Tamura | ............... | C23C 16/4401 118/723 ER |
| 5,592,581 A * | 1/1997 | Okase | ..................... | C23C 16/46 118/50.1 |
| 5,614,055 A * | 3/1997 | Fairbairn | .............. | H01J 37/321 118/723 AN |
| 5,618,349 A * | 4/1997 | Yuuki | ................. | C23C 16/4412 118/715 |
| 5,620,523 A * | 4/1997 | Maeda | ................. | H01J 37/3211 118/715 |
| 5,792,261 A * | 8/1998 | Hama | ................. | C23C 16/4404 118/723 I |
| 5,968,377 A * | 10/1999 | Yuasa | ............... | H01J 37/32018 118/723 R |
| 5,968,593 A * | 10/1999 | Sakamoto | ......... | H01L 21/67109 118/715 |
| 6,013,155 A * | 1/2000 | McMillin | ............. | C23C 16/455 118/723 I |
| 6,042,687 A * | 3/2000 | Singh | .................... | H01J 37/321 118/723 I |
| 6,132,552 A * | 10/2000 | Donohoe | ............ | C23C 16/4405 118/723 I |
| 6,139,642 A * | 10/2000 | Shimahara | ......... | C23C 16/4401 118/715 |
| 6,204,194 B1 * | 3/2001 | Takagi | ................ | C23C 16/4412 257/E21.279 |
| 6,270,862 B1 * | 8/2001 | McMillin | .............. | C23C 16/455 427/569 |
| 6,299,725 B1 * | 10/2001 | Donohoe | ............ | C23C 16/4405 118/723 I |
| 6,302,962 B1 * | 10/2001 | Nam | ....................... | C30B 31/12 118/696 |
| 6,365,016 B1 * | 4/2002 | Iacovangelo | .......... | C23C 14/228 204/192.38 |
| 6,413,884 B1 * | 7/2002 | Moriyama | .............. | C30B 31/16 438/784 |
| 6,444,262 B1 * | 9/2002 | Kitamura | ............. | C23C 16/4412 118/715 |
| 6,830,786 B2 * | 12/2004 | Yuda | .................. | C23C 16/5096 118/723 ER |
| 6,835,277 B2 * | 12/2004 | Park | ................. | H01J 37/32357 118/723 ME |
| 6,872,258 B2 * | 3/2005 | Park | .................. | C23C 16/45565 118/715 |
| 6,972,055 B2 * | 12/2005 | Sferlazzo | .......... | C23C 16/45508 118/719 |
| 7,115,184 B2 * | 10/2006 | Ohmi | ................ | H01J 37/32192 118/723 MW |
| 7,520,245 B2 * | 4/2009 | Ohmi | ...................... | C23C 16/24 118/723 AN |
| 7,578,883 B1 * | 8/2009 | Williams | ............... | B01D 53/38 118/715 |
| 7,727,296 B2 * | 6/2010 | Tojo | ....................... | B01D 45/06 118/715 |
| 7,749,326 B2 * | 7/2010 | Kim | ................... | C23C 16/45508 118/715 |
| 7,846,291 B2 * | 12/2010 | Otsuki | ................ | C23C 16/4404 118/723 R |
| 8,307,781 B2 * | 11/2012 | Suzuki | .......................... | 118/715 |
| 8,329,593 B2 * | 12/2012 | Yousif | ............... | H01J 37/32357 216/58 |
| 8,420,167 B2 * | 4/2013 | Nakashima | ........... | C23C 16/345 427/248.1 |
| 8,683,943 B2 * | 4/2014 | Onodera | ............... | C23C 16/402 118/666 |
| 9,028,614 B2 * | 5/2015 | Hara | ...................... | C30B 25/08 118/724 |
| 2001/0003271 A1 * | 6/2001 | Otsuki | ................ | C23C 16/4404 118/723 I |
| 2001/0015261 A1 * | 8/2001 | Kobayashi | ........ | H01J 37/32082 156/345.41 |
| 2002/0043216 A1 * | 4/2002 | Hwang | ................ | C23C 16/45525 118/723 VE |
| 2003/0098372 A1 * | 5/2003 | Kim | ................... | C23C 16/45525 239/548 |
| 2006/0029735 A1 * | 2/2006 | Ko | ....................... | H01L 21/0223 427/248.1 |
| 2006/0032443 A1 * | 2/2006 | Hasebe | .................... | C23C 16/30 118/715 |
| 2006/0065196 A1 * | 3/2006 | Yokogawa | ..................... | 118/728 |
| 2007/0062448 A1 * | 3/2007 | Maeda | ............. | C23C 16/45512 118/715 |
| 2007/0157882 A1 * | 7/2007 | Ozaki | ................. | H01L 21/0223 118/715 |
| 2007/0289535 A1 * | 12/2007 | Umeda | ............... | C23C 16/45565 118/724 |
| 2008/0179291 A1 * | 7/2008 | Collins | .................... | B08B 7/00 216/67 |
| 2008/0193645 A1 * | 8/2008 | Toda | ........................ | B01B 1/005 427/255.23 |
| 2009/0151632 A1 * | 6/2009 | Okuda | ............... | C23C 16/45538 118/666 |
| 2010/0151682 A1 * | 6/2010 | Moriya | ................... | C23C 16/24 438/680 |
| 2010/0218724 A1 * | 9/2010 | Okada | ................ | C23C 16/4405 118/724 |
| 2010/0275848 A1 * | 11/2010 | Fukuda | ................. | C23C 16/325 118/728 |
| 2012/0180727 A1 * | 7/2012 | Hasegawa | ......... | C23C 16/45578 118/730 |
| 2012/0223257 A1 * | 9/2012 | Nagai | ................. | G03F 7/70025 250/504 R |
| 2013/0098293 A1 * | 4/2013 | Lee | ..................... | C23C 16/4583 118/728 |
| 2013/0098455 A1 * | 4/2013 | Ng | ........................ | C23C 16/303 137/1 |
| 2014/0166618 A1 * | 6/2014 | Tadigadapa | ....... | H01J 37/32715 216/67 |

FOREIGN PATENT DOCUMENTS

| | | |
|---|---|---|
| KR | 1020070091228 A | 9/2007 |
| KR | 1020090009572 A | 1/2009 |
| KR | 1020110000861 A | 1/2011 |

* cited by examiner

CHEMICAL VAPOR DEPOSITION APPARATUS

CROSS-REFERENCE TO RELATED APPLICATIONS

This application claims the priority of Korean Patent Application No. 10-2011-0107485 filed on Oct. 20, 2011, in the Korean Intellectual Property Office, the disclosure of which is incorporated herein by reference.

BACKGROUND

1. Technical Field

The present disclosure relates to a chemical vapor deposition apparatus.

2. Description of the Related Art

Demand for light emitting diodes (LEDs) and semiconductor light emitting devices has increased dramatically due to applications thereof in mobile phone keypads, back light units (BLUs) for liquid crystal displays (LCDs) used in monitors or televisions, and general illumination devices.

In accordance with this trend, research has been conducted in several ways. One approach has been to use a large diameter sapphire wafer (e.g. 6 inches instead of 4 inches) for growing a nitrite semiconductor or an oxide semiconductor (for example, GaN, ZnO) as an epitaxial thin film in a light emitting device. Another effort has been to introduce a batch type of metal organic chemical vapor deposition (MOCVD) technology that allows a large number of wafers (e.g. 25 or 50 wafers) to be produced at the same time when an epitaxial thin film is grown.

Particularly, in a batch type deposition apparatus, it is important to have uniformity in the thin film grown on a number of wafers. However, because a number of wafers are loaded and arranged in the batch type deposition apparatus, it may be difficult to maintain an air current in a stable state. Therefore, it is difficult to achieve uniform deposition of a thin film in the batch type deposition apparatus.

SUMMARY

According to an aspect of the present inventive concepts, a batch type chemical vapor deposition apparatus capable of maintaining stability in a flow of reaction gas supplied to a reaction chamber is provided to obtain uniformity with respect to the reaction gas provided to a plurality of wafers loaded in a wafer boat.

According to an aspect of the present inventive concepts, a chemical vapor deposition apparatus can include: a reaction chamber having a reaction space therein; a wafer boat disposed in the reaction space, the wafer boat arranged and structured to support a plurality of wafers; and a gas supplying part disposed in the reaction chamber to supply two or more reaction gases to the plurality of wafers, the gas supplying part comprising: a plurality of gas pipes disposed in the reaction chamber to supply the two or more reaction gases from outside to the reaction space; and a plurality of supplying pipes disposed around the wafer boat, wherein each of the supplying pipes is connected to two or more corresponding gas pipes, and wherein each supplying pipe is configured to supply the two or more reaction gases supplied by the two or more corresponding gas pipes to a corresponding one of the wafers.

According to another aspect of the present inventive concepts, a chemical vapor deposition apparatus can include: a reaction chamber having a reaction space therein; a wafer holder disposed in the reaction space, the wafer holder arranged and structured to hold a wafer; a first gas pipe disposed in the reaction chamber to supply a first reaction gas from outside to the reaction space; a second gas pipe disposed in the reaction chamber to supply a second reaction gas from outside to the reaction space; and a supplying pipe connected to the first and second gas pipes, wherein an interior space of the supplying pipe is divided into multiple spaces to prevent mixing of the first and second gases within the supplying pipe.

According to another aspect of the present inventive concepts, a chemical vapor deposition apparatus can include: a reaction chamber having a reaction space therein; a plurality of gas pipes disposed in the reaction space and extending in a substantially vertical direction; and a plurality of supplying pipes, wherein each of the supplying pipes extends in a substantially horizontal direction and is connected to one or more corresponding gas pipes, wherein each supplying pipe has a plurality of separated portions.

BRIEF DESCRIPTION OF THE DRAWINGS

The above and other aspects, features and other advantages of the present inventive concepts will be more clearly understood from the following detailed description taken in conjunction with the accompanying drawings, in which.

DETAILED DESCRIPTION

Figure 1:
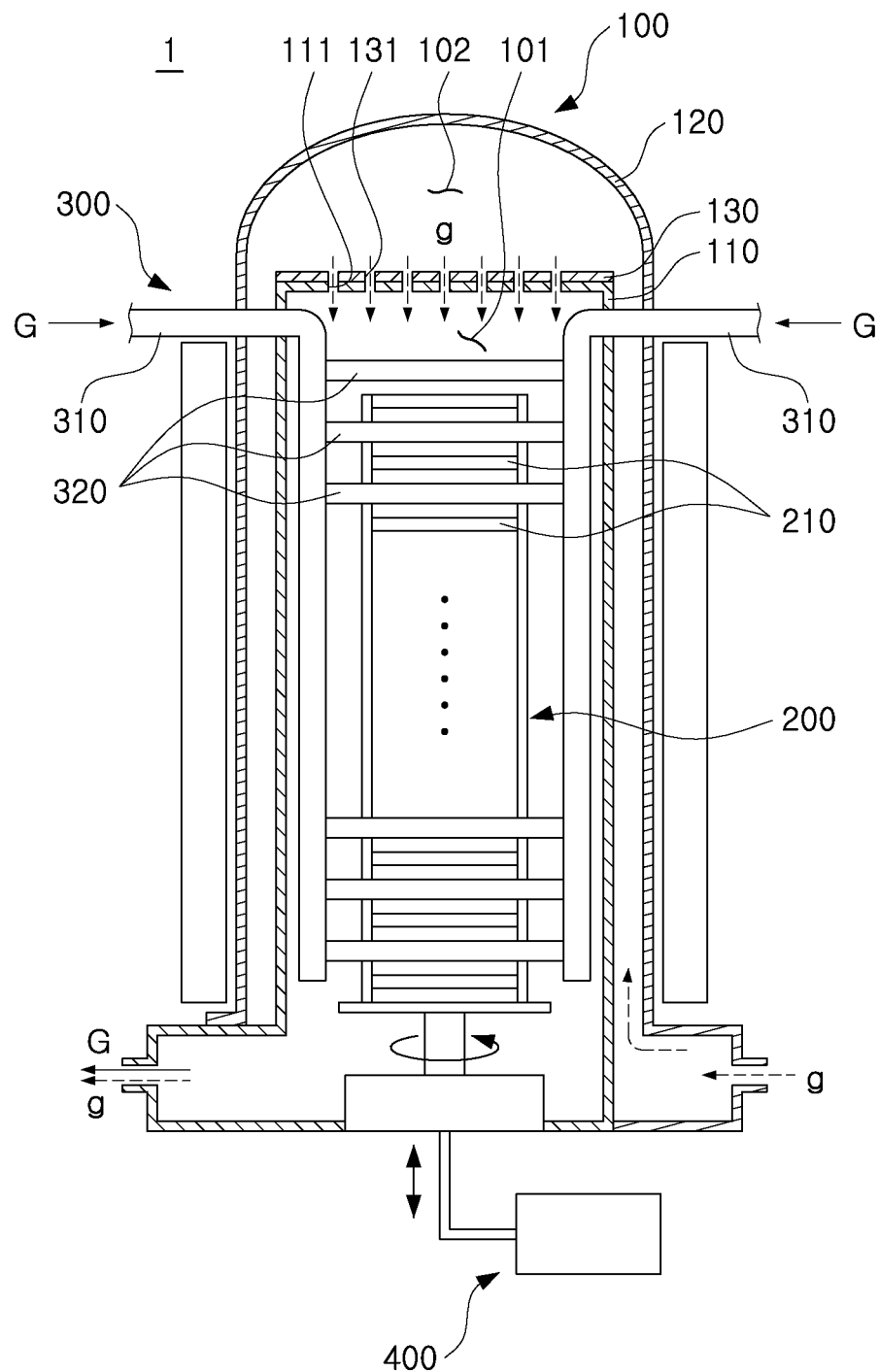
FIG. 1 is a cross-sectional view schematically illustrating a chemical vapor deposition (CVD) apparatus according to an embodiment of the present inventive concepts.

A chemical vapor deposition apparatus according to embodiments of the present inventive concepts will be described with reference to the accompanying drawings. The embodiments of the present inventive concepts may be modified in many different manners and the scope of the invention should not be seen as being limited to the embodiments set forth herein.

Rather, these embodiments are provided so that this disclosure will be thorough and complete, and will fully convey the concept of the invention to those skilled in the art. Therefore, the shape and the size of components shown in the drawings may be exaggerated for clarity.

The terms used in the present specification are merely used to describe particular embodiments, and are not intended to limit the inventive concepts to any particular embodiment thereof. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A chemical vapor deposition apparatus according to an embodiment of the present inventive concepts will be described with reference to FIGS. 1 through 7.

Figures 2A, 2B:
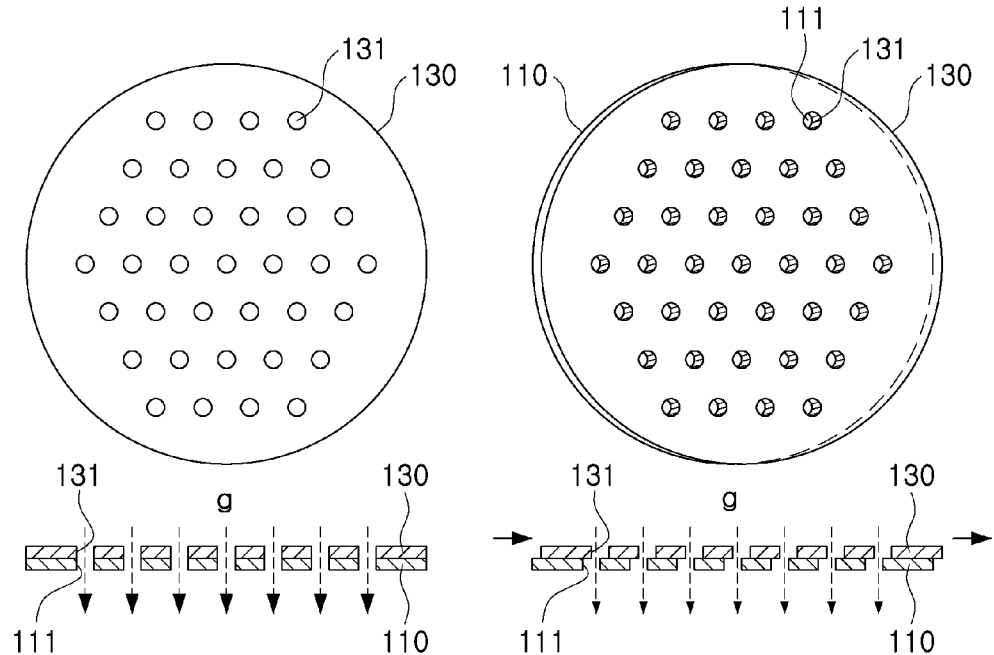
FIGS. 2A through 2C are views schematically illustrating an operational principle of a gate part of the CVD apparatus shown in FIG. 1.
Figure 2C:
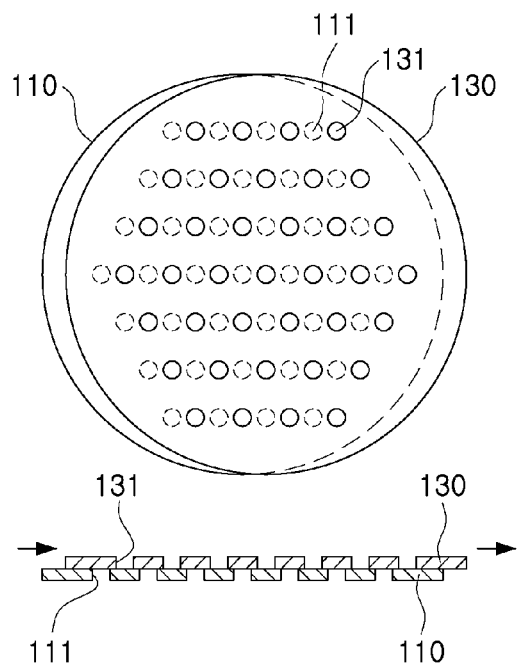
Figure 3A:
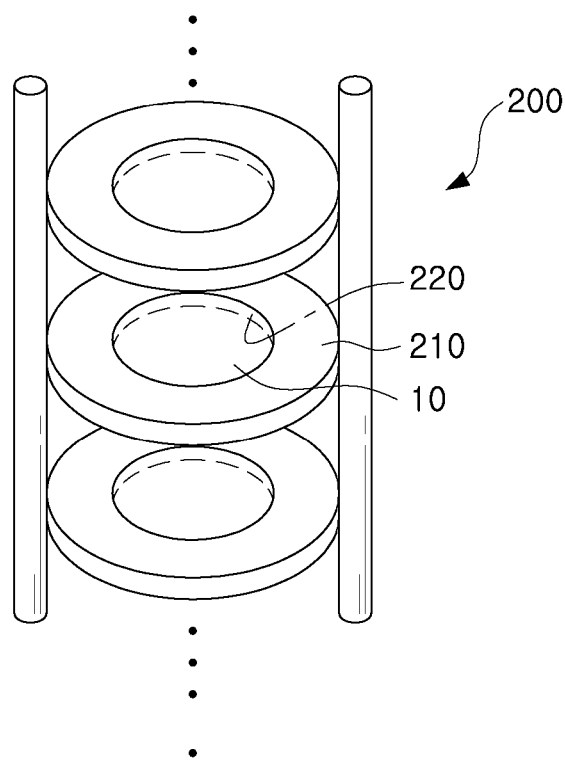
FIGS. 3A and 3B are views schematically illustrating a holder that may be used in a wafer boat of the CVD apparatus of FIG. 1.
Figure 3B:
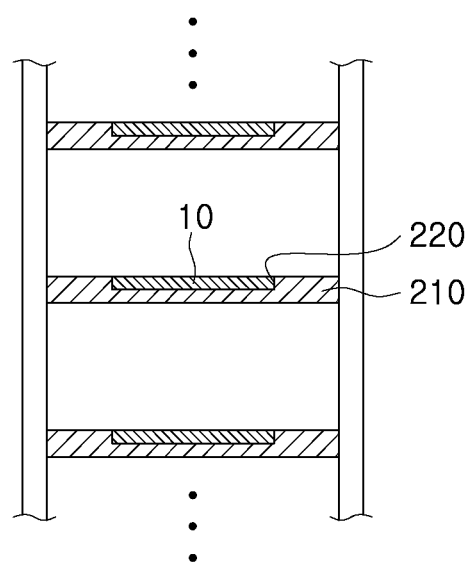
Figure 4:
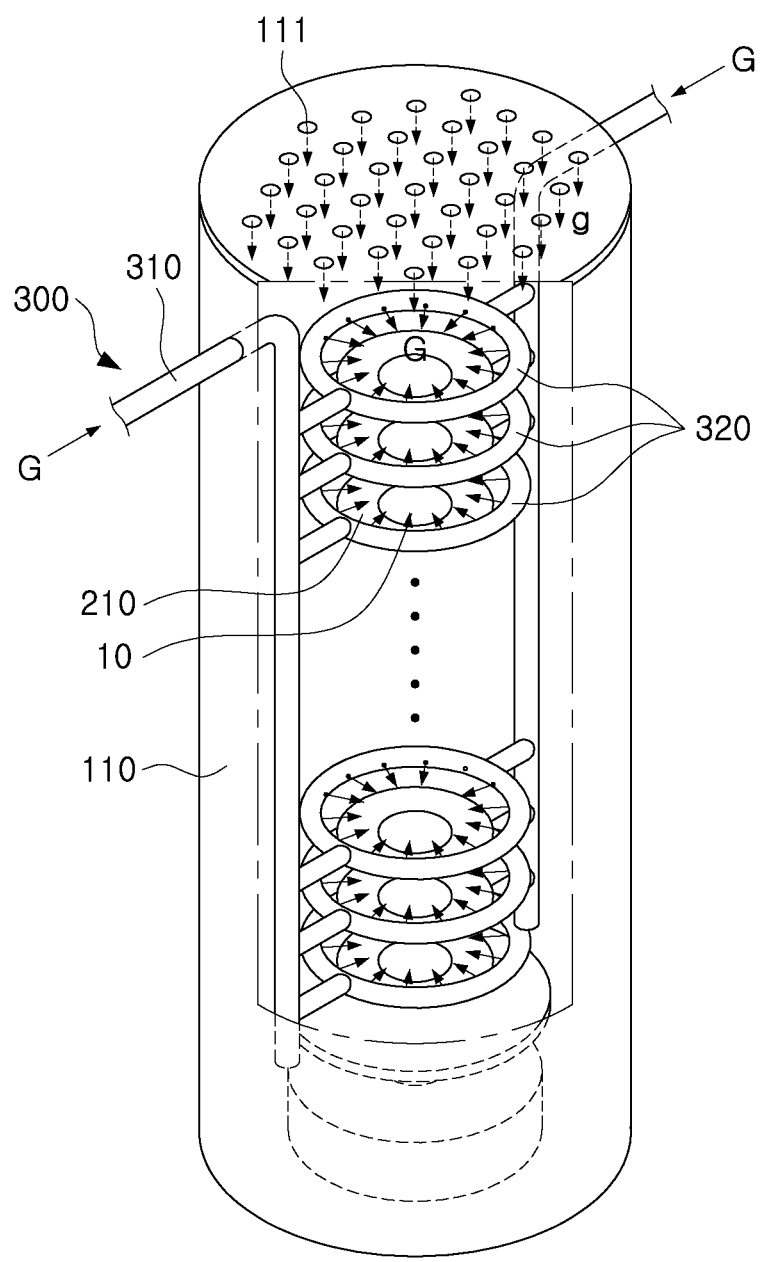
FIG. 4 is a perspective view schematically illustrating a gas supplying part that may be used in the chemical vapor deposition apparatus shown in FIG. 1.
Figure 5A:
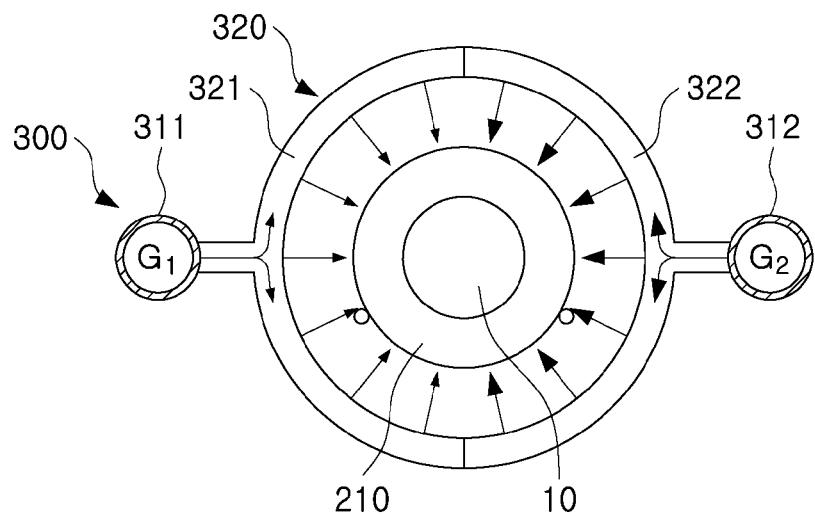
FIGS. 5A through 5C are plan views schematically illustrating various potential embodiments of the supplying pipes of the gas supplying part shown in FIG. 4.
Figure 5B:
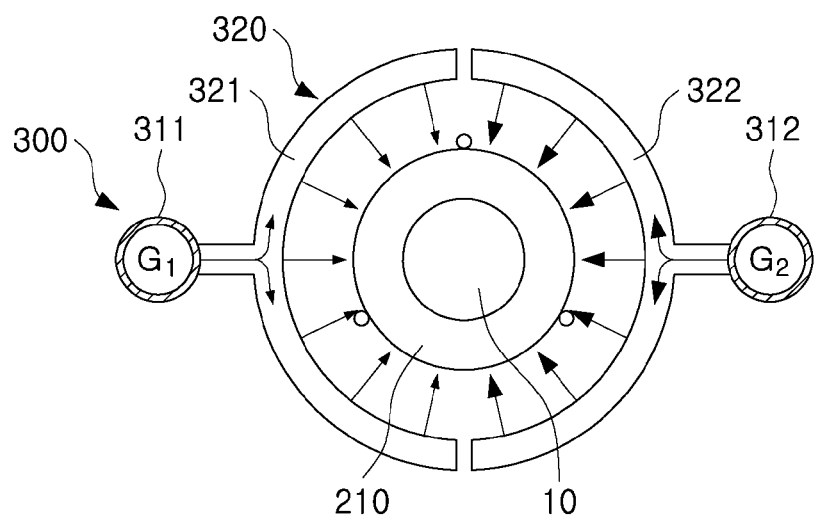
Figure 5C:
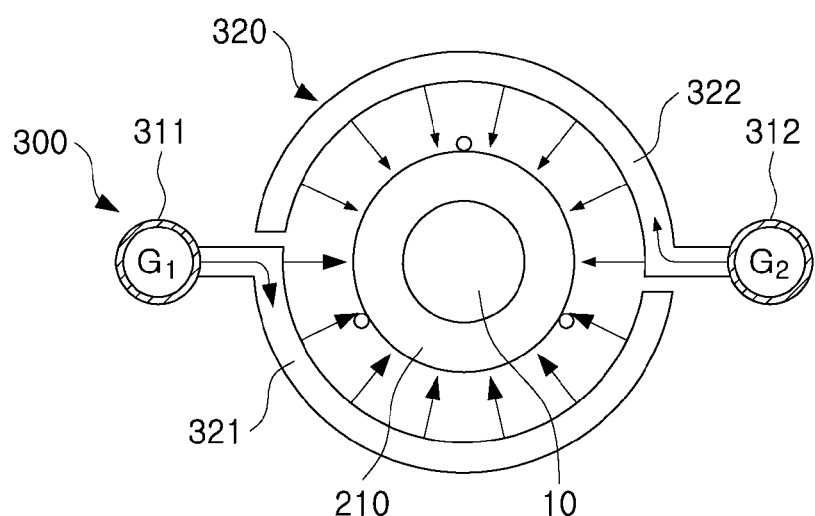
Figure 6:
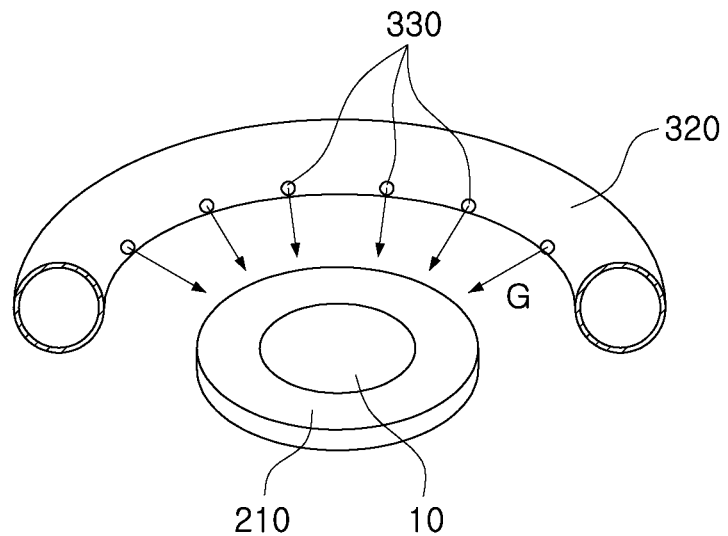
FIG. 6 is a cut-away perspective view schematically illustrating a structure by which reaction gas may be supplied through the supplying pipe shown in FIGS. 5A through 5C.
Figure 7:
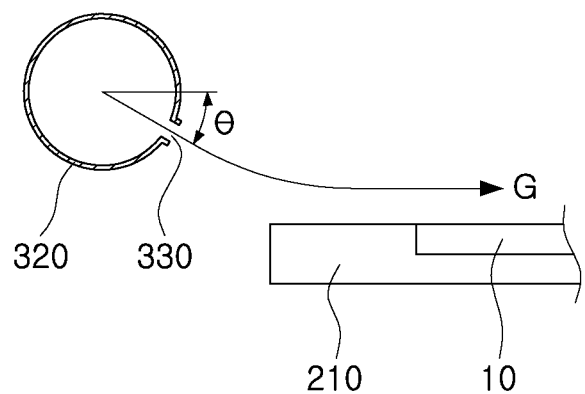
FIG. 7 is a cross-sectional view schematically illustrating a supplying nozzle that may be used in the supplying pipe shown in FIG. 6.

FIG. 1 is a cross-sectional view schematically illustrating a chemical vapor deposition apparatus according to an embodiment of the present inventive concepts; FIGS. 2A through 2C are views schematically illustrating operational principles of a gate part of the CVD apparatus shown in FIG. 1; and FIGS. 3A and 3B schematically illustrate a holder that may be used in a wafer boat of the CVD apparatus of FIG. 1. FIG. 4 is a perspective view schematically illustrating a gas supplying part that may be used in the chemical vapor deposition apparatus shown in FIG. 1, while FIGS. 5A through 5C are plan views schematically illustrating various configurations of a supplying pipe of the gas supplying part shown in FIG. 4; FIG. 6 is a cut-away perspective view schematically illustrating a structure by which reaction gas may be supplied through the supplying pipe of FIGS. 5A through 5C; and FIG. 7 is a cross-sectional view schematically illustrating a supplying nozzle that may be used in the supplying pipe of FIG. 6.

Referring to FIGS. 1 through 7, the chemical vapor deposition apparatus 1 according to an embodiment of the present invention may include a reaction chamber 100, a wafer boat 200, and a gas supplying part 300.

The reaction chamber 100 may include a reaction space 101 therein having a predetermined size. The reaction chamber 100 may further have a dual chamber structure with an internal chamber 110 having a cylindrical tubular shape, for example, and an external chamber 120 covering the internal chamber 110 and also having a cylindrical tubular shape, for example, along with a dome-shaped top. The internal and external chambers 110 and 120 may be formed of a material capable of withstanding a high temperature, such as quartz, silicon carbide (SiC), or the like.

The reaction chamber 100 may include a plurality of spraying or supplying holes 111 formed through an upper surface thereof in order to supply ambient gas (g) from the outside into the reaction space 101. The plurality of spraying holes 111 may be uniformly dispersed over the entire upper surface of the inner chamber 110. The reaction chamber 100 may provide a receiving space 102 within the dome-shaped top area between the internal chamber 110 and the external chamber 120, to receive the ambient gas (g). Therefore, the ambient gas (g) provided to the receiving space 102 may be uniformly supplied into the reaction space 101 through the plurality of spraying holes 111. As described above, the ambient gas (g) can be supplied into and diffused in an inner portion of the reaction space 101 at an upper portion of the reaction chamber 100 in a showering scheme, such that reaction gas G supplied through a gas supplying part 300 to be described below may be uniformly supplied to the entirety of a plurality of wafers 10. The ambient gas (g) may, for instance, include $N_2$, $H_2$, $O_2$, $NH_3$, or the like.

Meanwhile, the reaction chamber 100 may further include a gate part 130 formed on the upper surface of the reaction chamber to open and close the plurality of spraying holes 111 to adjust a flux of the ambient gas g supplied through the plurality of spraying holes 111. The gate part 130 may have a shape corresponding to that of the upper surface of the internal chamber 110 and include a plurality of through holes 131 formed at positions corresponding to those of the plurality of spraying holes 111. As shown in FIGS. 2A through 2C, the gate part 130 may adjust the size of the openings of the spraying holes 111 by changing the position of the through holes 131 with respect to the spraying holes 111.

More specifically, as shown in FIG. 2A, when the through holes 131 directly overlap the spraying holes 111, the spraying holes 111 may be completely opened. However, as shown in FIG. 2B, where the gate part 130 is partially moved with respect to the upper surface of the internal chamber 110 to cause the through holes 131 to only partially overlap the spraying holes 111, the spraying holes 111 are only partially opened, such that a flux of the ambient gas (g) passing through the spraying holes may be reduced. And, as shown in FIG. 2C, when the gate part 130 moves with respect to the upper surface of the internal chamber 110 such that the through holes 131 are not aligned at all with the spraying holes 111, the spraying holes 111 are completely closed, and the ambient gas (g) is not supplied into the reaction space 101.

As described above, the gate part 130 may therefore be used to adjust the flux of the ambient gas (g) supplied through the spraying holes 111 by controlling the opening of the spraying holes 111. The gate part 130 may be driven and controlled by a driving apparatus (not shown).

The wafer boat 200 may be arranged and structured to support a plurality of wafers. The plurality of wafers 10 may be loaded in the wafer boat 200 at predetermined intervals in order to grow a thin film. To this end, the wafer boat 200 may include holders 210 on which corresponding ones of the plurality of wafers 10 are respectively disposed. Each of the holders 210 can be arranged and structured to hold the wafer 10 and may include a receptacle 220 formed in a central portion thereof that is sized and shaped to receive the wafer 10.

The plurality of holders 210 may be arranged at predetermined intervals in a vertical direction, and a loading interval between the wafers 10 may be defined by an arrangement interval between the holders 210. The arrangement interval between the holders 210 may be adjusted in consideration of a size of the reaction chamber 100, or based on other factors.

As shown in FIGS. 3A and 3B, the receptacle 220 provided in each holder 210 may be depressed from an upper surface of the holder 210 to a depth corresponding to a thickness of the wafer 10. Therefore, an upper surface of the wafer 10 disposed in the receptacle 220 and the upper surface of the holder 210 may form a coplanar surface without variation in the vertical positions therebetween. As described above, when the upper surface of the wafer 10 and the upper surface of the holder 210 form a coplanar surface, the reaction gas (G) flowing to the upper portion of the holder 210 may be maintained in a stable laminar flow state, such that uniformity of the thin film deposited on the wafer 10 may be improved. A single receptacle 220 or a plurality of receptacles 220 may be formed in each holder 210.

The wafer boat 200 may be formed of a material such as quartz, or the like, so as to endure high temperatures and high pressure atmospheres in the reaction chamber 100, but is not limited thereto.

The wafer boat 200 may be loaded in the reaction chamber 100 using a driving part 400 that is protected by a heat insulation member. The driving part can therefore be disposed in the reaction space 100 or be unloaded outside the reaction chamber 100. In addition, the wafer boat 200 may be configured to rotate within the reaction chamber 101 at a predetermined speed.

The gas supplying part 300 may be disposed in the reaction chamber 100 to supply one or more reaction gases (G) from the outside to the reaction space 101 so as to grow a semiconductor epitaxial thin film on the surface of each wafer 10. More specifically, the gas supplying part 300 may include a plurality of gas pipes 310 disposed around the wafer boat 200 to supply the one or more reaction gases from outside to the reaction space 101, and a plurality of supplying pipes 320, wherein each of the supplying pipes 320 is connected to one or more corresponding gas pipes 310, and wherein each supplying pipe 320 is configured to supply the one or more reaction gases from the one or more corresponding gas pipes 320 to a corresponding one of the wafers 10.

The plurality of gas pipes 310 may extend in a substantially vertical direction between the wafer boat 200 and the internal chamber 110 (e.g. in a direction in which the plurality of wafers 10 are loaded in the wafer boat 200) to thereby be disposed parallel to the wafer boat 200.

The plurality of gas pipes 310 may supply the one or more reaction gases (G) throughout the length of the reaction chamber 100, from an upper portion of the reaction chamber 100 to a lower portion thereof, to allow the reaction gas G to be uniformly supplied to each portion of the reaction chamber 100. In addition, the reaction gases (G) supplied through respective gas pipes 310 may be the same or different.

The reaction gas (G) used for a nitride semiconductor (Ga(Al, In)N) alloy or a doping source, may include, for example, TMGa, TEGa, TMIn, TMAl, $SiH_4$, $Cp_2Mg$, DEZn, $NH_3$, $H_2$, $N_2$, or the like. In addition, the reaction gas (G) used to form an oxide semiconductor (Ga(Al, In)N) alloy or a doping source may include DMGa, DEZn, $Cd[(EPiPr_2)_2N]_2$ (E=S, Se), $Cp_2Mg$, $N_2$, Ar, $O_2$, $N_2O$, $O_3$ or the like.

As shown in FIGS. 1 and 4 through 5C, a plurality of supplying pipes 320 can be provided, wherein each of the supplying pipes extends in a substantially horizontal direction and is connected to one or more corresponding gas pipes 310, and wherein each supplying pipe 320 is configured to supply the one or more reaction gases (G) supplied by the one or more corresponding gas pipes 310 to a corresponding one of the wafers 10. More specifically, the plurality of supplying pipes 320 may have a ring shaped structure and may to the number of supplying pipes 320 may correspond to the number of wafer holders 210 for holding loaded wafers 10. In addition, the plurality of supplying pipes 320 may be arranged to be substantially parallel to the corresponding loaded wafer 10. Here, a spacing between the plurality of supplying pipes 320 corresponds to a spacing between wafer holders 210 arranged in the wafer boat 200. As described above, the supplying pipes 320 are provided and configured to uniformly supply the reaction gas (G) onto respective wafers 10, thereby securing the uniformity between individual wafers of a thin film deposited thereon. Although these figures illustrate the supplying pipe 320 as having a ring shape, the present inventive concepts are not limited thereto. That is, although not shown in the accompanying drawings, the supplying pipe 320 may alternatively have a triangular shape, a quadrangular shape, or another polygonal shape. As shown in FIGS. 4 through 5C, at least one of the plurality of supplying pipes 320 can have a plurality of separated portions to prevent mixing of two or more of the reaction gases (G).

More specifically, the number of separated portions of the supplying pipe 320 can correspond to the number of gas pipes 310. For example, as shown in FIGS. 5A through 5C, where two gas pipes 310 (first gas pipe 311 and second gas pipe 312) are provided, a supplying pipe 320 is connected to the first and second gas pipes, and an interior space of the supplying pipe 320 is divided to prevent mixing of the first gas (G1) from the first gas pipe 311 and the second gas (G2) from second gas pipe 312. As shown in FIGS. 5B and 5C, each divided space of the supplying pipe can be spaced apart from the other divided spaces thereof by a predetermined interval.

Further, any one separated portion 321 of one or more of the plurality of supplying pipes 320 may be in communication with any one gas pipe 311 of the plurality of gas pipes 310. And the other separated portion(s) 322 of one or more of the plurality of supplying pipes 320 may be in communication with a respective one of the other gas pipe(s) 312 of the plurality of gas pipes 310. That is, as shown in FIGS. 5A through 5C, the first separated portion 321 of the supplying pipe 320 may be connected to only the first gas pipe 311, and the second separated portion 322 (which is separated either as a physically separate pipe or as an internally segregated pipe from the first spraying pipe 321) may be connected to only the second gas pipe 312. Therefore, a first reaction gas (G1) supplied through the first gas pipe 311 may be supplied through the first separated portion 321 in a state in which the reaction gas (G1) is not mixed with a second reaction gas (G2) supplied through the second gas pipe 312 until it is supplied into the reaction space 101.

This solves multiple problems associated with conventional technology, in which multiple reaction gases are supplied through a single gas pipe and the reaction gases therefor generate a reaction in the gas pipe before being sprayed onto the wafer, including clogging of the gas pipe or non-uniform spray flux. Therefore, according to embodiments of the present inventive concepts, the routes through which the various reaction gases (G) travel are kept separate, and the various reaction gases (G) that are separately supplied through multiple gas pipes can be supplied to the reaction space 101 in a state in which they are separated from each other. In this way, existing problems resulting from the premixing of the reaction gases (G) before they are supplied into the reaction chamber 100 may be effectively solved. In addition, a flux of the reaction gases (G) may be easily adjusted.

The supplying pipe 320 may be formed of a material, such as quartz, ceramic, molybdenum (Mo), carbon (C), or the like, so as to endure high temperatures.

Meanwhile, as shown in FIGS. 6 and 7, the supplying pipes 320 can have a plurality of supplying nozzles 330 formed along an inner surface of the pipe facing the wafer boat 200 to supply the corresponding reaction gas to the corresponding wafer 10.

More specifically, as shown in FIG. 7, the plurality of supplying nozzles 330 may be downwardly inclined toward the wafer 10 by a predetermined gradient (θ). In addition, the gradient (θ) of the supplying nozzle 330 may be variously changed according to a position at which the supplying pipe 320 is disposed.

As set forth above, according to various embodiments of the present inventive concepts, a chemical vapor deposition apparatus can be provided which is capable of maintaining stability of an air flow of the reaction gas supplied into the reaction chamber and securing uniformity of the reaction gas sprayed onto the plurality of wafers loaded in the wafer boat.

While the present inventive concepts have been shown and described in connection with these enumerated embodiments, it will be apparent to those skilled in the art that modifications and variations can be made to those embodiments without departing from the spirit and scope of the invention as defined by the appended claims.

What is claimed is:

1. A chemical vapor deposition apparatus comprising:
a reaction chamber having a reaction space therein;
a wafer boat disposed in the reaction space, the wafer boat arranged and structured to support a plurality of wafers such that the plurality of wafers are spaced apart from each other in a vertical direction in the reaction space; and
a gas supplying part disposed in the reaction chamber to supply one or more reaction gases to the plurality of wafers, the gas supplying part comprising:
a plurality of gas pipes disposed in the reaction chamber to supply the one or more reaction gases from outside to the reaction space;
a plurality of supplying pipes disposed around the wafer boat, wherein the plurality of supplying pipes are arranged spaced apart from each other in the vertical direction such that each of the supplying pipes is disposed around a corresponding one of the wafers and is connected to one or more corresponding gas pipes, and wherein each supplying pipe is configured to supply the one or more reaction gases supplied by the one or more corresponding gas pipes to the corresponding one of the wafers;
wherein the reaction chamber includes a plurality of spraying holes formed in an upper surface thereof to supply ambient gas from outside into the reaction space; and
wherein the reaction chamber further includes a gate part formed on the upper surface of the reaction chamber to open or close the plurality of spraying holes to adjust a flux of the ambient gas supplied through the plurality of spraying holes.

2. The chemical vapor deposition apparatus of claim 1, wherein at least one of the plurality of supplying pipes has a plurality of separated portions to prevent mixing of the two or more of the reaction gases.

3. The chemical vapor deposition apparatus of claim 2, wherein the number of the separated portions corresponds to the number of gas pipes.

4. The chemical vapor deposition apparatus of claim 2, wherein one portion of at least one of the plurality of supplying pipes is spaced apart from the other portions thereof in a substantially horizontal direction.

5. The chemical vapor deposition apparatus of claim 1, wherein at least one of the plurality of supplying pipes has a ring shaped structure arranged substantially parallel to the corresponding wafer at substantially the same vertical position as the corresponding wafer.

6. The chemical vapor deposition apparatus of claim 5, wherein a vertical spacing between the plurality of supplying pipes corresponds to a vertical spacing between wafer holders arranged in the wafer boat.

7. The chemical vapor deposition apparatus of claim 1, wherein at least one of the plurality of supplying pipes has a plurality of supplying nozzles formed along an inner surface of the pipe facing the wafer boat to supply the corresponding reaction gas to the corresponding wafer.

8. The chemical vapor deposition apparatus of claim 7, wherein the plurality of supplying nozzles are downwardly inclined toward the corresponding wafer.

9. A chemical vapor deposition apparatus comprising:
a reaction chamber having a reaction space therein;
a plurality of wafer holders disposed in the reaction space and spaced apart from each other in a vertical direction, each of the wafer holders arranged and structured to hold a wafer;
a first gas pipe disposed in the reaction chamber to supply a first reaction gas from outside to the reaction space;
a second gas pipe disposed in the reaction chamber to supply a second reaction gas from outside to the reaction space; and
a plurality of supplying pipes, each supplying pipe being substantially contiguous and connected to both of the first and second gas pipes, wherein an interior space of one or more of the supplying pipes is divided to prevent mixing of the first and second gases, and
wherein the plurality of supplying pipes are arranged spaced apart from each other in the vertical direction in the reaction space such that each of the supplying pipes is disposed around a corresponding one of the plurality of wafer holders;
wherein the reaction chamber includes a plurality of spraying holes formed in an upper surface thereof to supply ambient gas from outside into the reaction space; and
wherein the reaction chamber further includes a gate part formed on the upper surface of the reaction chamber to open or close the plurality of spraying holes to adjust a flux of the ambient gas supplied through the plurality of spraying holes.

10. The chemical vapor deposition apparatus of claim 9, wherein the number of divided spaces of the supplying pipe corresponds to the number of gas pipes.

11. The chemical vapor deposition apparatus of claim 10, wherein each divided space of the supplying pipe is spaced apart from the other divided spaces thereof.

12. The chemical vapor deposition apparatus of claim 9, wherein the first and second gas pipes extend in a substantially vertical direction and the supplying pipes are arranged in a substantially horizontal direction.

13. The chemical vapor deposition apparatus of claim 9, wherein the wafer holder has a receptacle formed in a central portion to receive the wafer.

14. The chemical vapor deposition apparatus of claim 13, wherein the receptacle is depressed from an upper surface of the wafer holder to a depth corresponding to a thickness of the wafer.

15. A chemical vapor deposition apparatus comprising:
a reaction chamber having a reaction space therein;
a plurality of wafer holders arranged in the reaction space along a line that extends in a substantially vertical direction;
a plurality of gas pipes disposed in the reaction space, each of the gas pipes extending substantially in the vertical direction; and
a plurality of supplying pipes arranged at different vertical positions along an extending direction of the plurality of gas pipes, wherein each of the supplying pipes extends in a substantially horizontal direction and is connected to one or more corresponding gas pipes, wherein each supplying pipe has a plurality of separated portions, and
wherein each of the supplying pipes is disposed around a corresponding one of the plurality of wafer holders;
wherein the reaction chamber includes a plurality of spraying holes formed in an upper surface thereof to supply ambient gas from outside into the reaction space; and
wherein the reaction chamber further includes a gate part formed on the upper surface of the reaction chamber to open or close the plurality of spraying holes to adjust a flux of the ambient gas supplied through the plurality of spraying holes.

16. The chemical vapor deposition apparatus of claim 15, wherein the number of separated portions corresponds to the number of gas pipes.

17. The chemical vapor deposition apparatus of claim 15, wherein the separated portions of the supply pipe are spaced apart from each other.

18. The chemical vapor deposition apparatus of claim 15, wherein each of the plurality of supplying pipes has a plurality of supplying nozzles formed along an inner surface of the pipe facing the wafer boat to supply the corresponding reaction gas to the corresponding wafer.

* * * * *